United States Patent
Nakayoshi et al.

(10) Patent No.: US 7,700,678 B2
(45) Date of Patent: Apr. 20, 2010

(54) SILVER-BASED POWDER, METHOD OF PREPARATION THEREOF, AND CURABLE SILICONE COMPOSITION

(75) Inventors: Kazumi Nakayoshi, Chiba Prefecture (JP); Hiroki Ishikawa, Aichi Prefecture (JP); Ryoto Shima, Chiba Prefecture (JP); Katsutoshi Mine, Chiba Prefecture (JP)

(73) Assignee: Dow Corning Toray Company, Ltd., Tokyo (JP)

( * ) Notice: Subject to any disclaimer, the term of this patent is extended or adjusted under 35 U.S.C. 154(b) by 571 days.

(21) Appl. No.: 10/536,669

(22) PCT Filed: Nov. 17, 2003

(86) PCT No.: PCT/JP03/14608

§ 371 (c)(1),
(2), (4) Date: May 27, 2005

(87) PCT Pub. No.: WO2004/050753

PCT Pub. Date: Jun. 17, 2004

(65) Prior Publication Data

US 2006/0047043 A1    Mar. 2, 2006

(30) Foreign Application Priority Data

Nov. 29, 2002 (JP) .............................. 2002-347138

(51) Int. Cl.
*C08K 3/22* (2006.01)
*C08G 77/00* (2006.01)

(52) U.S. Cl. .......................................... 524/413; 528/10
(58) Field of Classification Search ................... 524/413
See application file for complete search history.

(56) References Cited

U.S. PATENT DOCUMENTS

| | | | | |
|---|---|---|---|---|
| 3,382,087 A | * | 5/1968 | Ostrowski | 428/626 |
| 3,532,528 A | * | 10/1970 | Bradshaw et. al. | 106/403 |
| 4,248,632 A | * | 2/1981 | Ehrich et al. | 106/1.11 |
| 5,384,075 A | * | 1/1995 | Okami | 252/511 |
| 5,447,661 A | * | 9/1995 | Takahashi et al. | 252/511 |
| 5,770,298 A | * | 6/1998 | Nakamura et al. | 428/195.1 |
| 5,908,897 A | * | 6/1999 | Nakamura et al. | 524/862 |
| 6,010,646 A | * | 1/2000 | Schleifstein | 252/500 |
| 6,017,587 A | * | 1/2000 | Kleyer et al. | 427/387 |
| 6,090,887 A | * | 7/2000 | Nakamura et al. | 524/862 |
| 6,136,447 A | * | 10/2000 | Nakamura et al. | 399/338 |
| 6,140,446 A | * | 10/2000 | Fujiki et al. | 528/15 |
| 6,225,433 B1 | * | 5/2001 | Isshiki et al. | 528/15 |
| 6,361,716 B1 | * | 3/2002 | Kleyer et al. | 252/514 |
| 6,465,550 B1 | * | 10/2002 | Kleyer et al. | 524/268 |
| 6,469,090 B1 | * | 10/2002 | Azechi et al. | 524/492 |
| 6,680,007 B2 | * | 1/2004 | Honda et al. | 252/511 |
| 6,734,250 B2 | * | 5/2004 | Azechi et al. | 524/588 |
| 6,797,772 B2 | * | 9/2004 | Nakayoshi et al. | 524/731 |
| 6,831,145 B2 | * | 12/2004 | Kleyer et al. | 528/23 |
| 2002/0099114 A1 | | 7/2002 | Nakayoshi et al. | |

FOREIGN PATENT DOCUMENTS

| | | |
|---|---|---|
| EP | 0 144 741 | 2/1984 |
| EP | 0 545 568 | 11/1992 |
| EP | 0 647 682 | 10/1994 |
| JP | 58-103565 | 6/1983 |
| JP | 58-103566 | 6/1983 |
| JP | 58-104970 | 6/1983 |
| JP | 62-53033 | 11/1987 |
| JP | 62-53034 | 11/1987 |
| JP | 62-53035 | 11/1987 |
| JP | 7-109501 | 4/1995 |
| JP | 07109501 A * | 4/1995 |
| JP | 7-150048 | 6/1995 |
| JP | 8-302196 | 11/1996 |

OTHER PUBLICATIONS

English language Abstract for JP 8-302196 extracted from espacenet.com database dated Nov. 9, 2005.
English language Abstract for JP 58-103565 extracted from espacenet.com database dated Nov. 8, 2005.
English language Abstract for JP 58-103566 extracted from espacenet.com database dated Nov. 8, 2005.
English language Abstract for JP 58-104970 extracted from espacenet.com database dated Nov. 8, 2005.
English language Abstract for JP 62-53033 extracted from espacenet.com database dated Dec. 20, 2005.
English language Abstract for JP 62-53034 extracted from espacenet.com database dated Dec. 20, 2005.
English language Abstract for JP 62-53035 extracted from espacenet.com database dated Dec. 20, 2005.

* cited by examiner

*Primary Examiner*—Randy Gulakowski
*Assistant Examiner*—Robert Loewe
(74) *Attorney, Agent, or Firm*—Howard & Howard Attorneys PLLC

(57) ABSTRACT

A silver-based powder is surface-treated with an oxidation inhibitor by means of a mechanochemical reaction. A method of preparation of the silver-based powder includes using an organic solution of the oxidation inhibitor as a lubricating agent, applying mechanical energy to the silver-based powder, and subjecting the silver-based powder to surface treatment with said oxidation inhibitor by means of a mechanochemical reaction.

11 Claims, No Drawings

SILVER-BASED POWDER, METHOD OF PREPARATION THEREOF, AND CURABLE SILICONE COMPOSITION

TECHNICAL FIELD

This invention relates to a silver-based powder, a method of preparation of the silver-based powder, and a curable silicone composition. More specifically, this invention relates to a silver-based powder that prevents decrease of curability of a curable organic resin composition in storage when the silver-based powder is compounded with the curable organic resin composition. This invention further relates to a method for preparation the silver-based powder with high efficiency, and a curable silicone composition characterized by a reduced change in curability over time during storage and by an ability to be cured into a cured silicone product with electrical properties that have minimal changes over time.

BACKGROUND ART

It has been shown in Japanese Official Patent Publications (hereinafter referred to as Kokoku) No. S62-53033, No. S62-53034, Japanese Laid-Open Patent Application Publications (hereinafter referred to as Kokai) No. S58-103565, No. S58-103566, Kokoku No. S62-53035, and Kokai S58-104970 that coating of the surface of a silver-alloy powder with benzotriazole improves migration-resistant properties. However, when the silver powder surface-coated with benzotriazole or a commonly available silver powder is compounded with a curable organic resin composition, the powder impairs curability of the composition in storage.

Silver powders are used with curable silicone compositions as electrically conductive and thermally conductive fillers that improve electrical and thermal conductivity of the compositions. However, the surfaces of commonly available silver powders normally contain some residual lubricants used in the manufacturing process, such as higher fatty acids, metal soaps, higher aliphatic alcohols or their esters, higher aliphatic amines, higher aliphatic amides, polyethylene waxes, etc. The presence of these residuals on the surfaces of the fillers significantly impairs curability of the curable silicone compositions during storage and some time later may lead to complete loss of curability.

Kokai No. H7-109501, Kokai No. H7-150048, and Kokai No. H8-302196 contain some proposals aimed at a solution of problems associated with the use of a silver powder surface-treated with an organosilicon compound and of a curable silicone composition compounded with a silver powder. However, the aforementioned proposals still appeared to be insufficient for restricting the decrease of curability in storage of the aforementioned curable silicone compositions.

It is an object of this invention to provide: a silver-based powder that, when compounded with a curable organic resin composition, does not decrease curability of the composition in storage; a method for preparation of the silver-based powder with high efficiency; and a curable silicone composition that is characterized by reduced changes in curability over time during storage and by an ability to be cured into a cured product with electrical properties that have minimal changes over time.

DISCLOSURE OF INVENTION

A silver-based powder of this invention is characterized by being surface-treated with an oxidation inhibitor by means of a mechanochemical reaction. A method of this invention for preparation of the silver-based powder is characterized by utilizing an organic solution of an oxidation inhibitor as a lubricating agent, applying mechanical energy to the silver-based powder, and subjecting the silver-based powder to surface treatment with the oxidation inhibitor. A curable silicone composition of this invention comprises the silver-based powder surface-treated with the oxidation inhibitor.

DETAILED DESCRIPTION OF THE INVENTION

The silver-based powder of this invention is characterized by the fact that it is surface-treated with an oxidation inhibitor by means of a mechanochemical reaction. More specifically, the surface of the silver-based powder can be activated and a chemical reaction with the oxidation inhibitor can be promoted if, in the presence of the oxidation inhibitor, mechanical energy is applied to the silver-based powder by subjecting it to crushing, shocking, rolling, etc.

The following raw materials can be used for the preparation of the silver-based powder of the invention: a reduced silver powder prepared in a granulated form by reducing an aqueous solution of a silver nitrate with the use of such reducing agents as hydrazine, formaldehyde, ascorbic acid, etc.; an electrolytic silver powder precipitated in a dendrite form on a cathode by subjecting an aqueous solution of silver nitrate to electrolytic decomposition; or atomized silver particles obtained in a granulated or irregular form by pulverizing molten silver hot-melted at a temperature above 1000° C. into water or inert gas. The powders may comprise fine powders of pure silver, silver-copper alloy, silver-palladium alloy or alloys of silver with other metals, such as zinc, tin, magnesium, nickel, etc.

Furthermore, the oxidation inhibitors for treating the surface of the silver-based powder of the invention may comprise a phenol-based compound, hindered phenol-based compounds and triazole-based compounds. The following are examples of the phenol-based compounds: 2,6-di-t-butyl-4-methyl phenol and 2,2'-methylene-bis(6-t-butyl-4-methylphenol). The following are examples of the hindered phenol-based compounds: triethyleneglycol-bis[3-(3-t-butyl-5-methyl-4-hydroxyphenyl)propionate, 2,4-bis(n-octylthio)-6-(4-hydroxy-3,5-di-t-butylanilino)-1,3,5-triazine, and 3,5-di-t-butyl-4-hydroxybenzyl-phosphonatediethyl ester. The triazole-based compounds can be exemplified by triazole, benzotriazole, 4-methylbenzotriazole, 5-methylbenzotriazole, 2-(5-methyl-2-hydroxyphenyl)benzotriazole, 2-(3,5-di-t-butyl-2-hydroxyphenyl)benzotriazole, and 2-(2'-hydroxy-5'-t-octylphenyl)benzotriazole. The benzotriazole-based compounds are preferred. The oxidation inhibitors may be used in a combination of two or more.

The silver-based powder particles suitable for application to them of mechanical energy may have the shape of flakes, dendrite flakes, or may have an irregular shape. Although there are no special restrictions with regard to the average size of the particles, it is recommended that they have the average size within the range of 1 to 20 micrometers (μm).

Since the silver-based powder of the invention possesses excellent electrical conductivity and thermal conductivity, it is suitable for use as an electrically conductive filler and a thermally conductive filler for compounding with thermosetting organic resins, thermoplastic organic resins, or curable silicone compositions. In particular, the most significant decrease in the change of curability and electrical properties of curable silicone compounds during storage is noticed when these compounds are combined with the silver-based powder of the invention. Therefore, the most advantageous application of the silver-based powder of the invention is an electrically conductive filler and a thermally conductive filler for curable silicone compositions.

The preparation method of this invention is characterized by using as an organic solution of an oxidation inhibitor as a lubricating agent and applying a mechanical energy to the silver-based powder. The silver-based powder suitable for use in the method of the present invention may comprise the aforementioned reduced silver powder, electrolytic silver powder, or the atomized silver powder. The silver-based powder may be prepared from pure silver, or from a silver-copper alloy, silver-palladium alloy, or alloys of silver with minute quantities of other metals such as zinc, tin, magnesium, nickel, etc. Although there are no special restrictions with regard to the size of the particles in the powder, to obtain the average size of silver-based particles within the range of 0.1 to 20 μm, it is recommended that a raw silver-based powder (used to prepare the silver-based powder of this invention) has an average particle size within the range of 0.1 to 50 μm. There are no restrictions on the shape of the silver-based particles, and the particles may have granular, dendrite, flake-like, or irregular shapes. Particles of two or more different shapes can be used in a mixture.

A majority of the aforementioned oxidation inhibitors are solid substances, so in the method of this invention the oxidation inhibitors may be used in the form of organic solutions. Organic solvents suitable for preparation of the organic solutions may be represented by methanol, ethanol, isopropanol, or similar alcoholic solvents; hexane, heptane, octane, or similar aliphatic solvents; cyclohexane, cyclooctane, or similar alicyclic solvents; toluene, xylene, or similar aromatic solvents; acetone, methylethylketone, methyl isobutylketone, or similar ketone-type solvents; and ethyl acetate, carbitol acetate, or similar ester-type solvents.

There are no special restrictions on the amounts in which the oxidation inhibitor should be added. However, it is recommended to add the oxidation inhibitor in an amount of 0.01 to 2 parts by weight per 100 parts by weight of the silver-based powder. If the oxidation inhibitor is added in an amount below the lower recommended limit of the range, it would be impossible to provide sufficient surface treatment of the silver powder. If the upper recommended limit is exceeded, the obtained silver-based powder either will have a reduced electrical and thermal conductivity, or lower affinity to the curable organic resin composition.

In accordance with the method of the invention, a mechanical energy is applied to the composition comprising raw silver-based powder and oxidation inhibitor. A mechanical reaction will activate the surface of the raw silver-based powder and promote the chemical reaction in which the oxidation inhibitor participates. In application of mechanical energy to the raw silver-based powder, the silver-based powder is surface-treated with the oxidation inhibitor, and the organic solvent solution of the oxidation inhibitor functions as a lubrication agent.

The mechanical energy can be applied by using stamp mill, ball mill, vibration mill, hammer mill, rolling mill, mortar, or a similar crusher, etc. There are no special restrictions with regard to the treatment temperature, but since the treatment is accompanied with generation of heat, the temperature should be adjusted between room temperature and 100° C. Treatment can be carried out from 1 to 50 hours. Since the treated silver-based powder can be coated with an excessive amount of the oxidation inhibitor stuck to the surface of the silver-based particles, if necessary, the excess of the inhibitor can be removed by rinsing the treated powder in an organic solvent with subsequent drying for 24 hours or more at a temperature from room temperature to 105° C.

The curable silicone composition of the invention comprises the aforementioned silver-based powder surface-treated with an oxidation inhibitor. In compounding with a curable silicone composition, the flake-like shape is preferred for obtaining cured silicone bodies of high electrical conductivity.

It is preferable to treat the surface of the silver-based powder with the oxidation inhibitor uniformly, but partial treating of the surface is also allowable. Although it is preferable to provide chemical bonds between the oxidation inhibitor and the silver-based powder surface, mere adherence to the surface is also allowable. When a coating film of the oxidation inhibitor is formed on the surface of the silver-based powder particles, the thinner the thickness of the coating film, the better the electrical and chemical conductivity of the cured silicone obtained from a mixture of the silver-based powder with the curable silicone composition. However, since curability of the curable silicone composition noticeably varies over time during storage, the thickness of the coating film should be optimally selected. Preferably, it should be thinner than 0.1 μm. The surface of the silver-based powder particles may appear to be treated with an excess of the oxidation inhibitor that adheres to the surface but does not participate in surface treatment. As has been explained above, this excess can be removed by rinsing in an organic solvent.

In preparation of the silver-based powder by the method of the invention, mechanical energy can be applied to the raw silver-based powder either after soaking with an organic solution of the oxidation inhibitor, or when the raw silver-based is immersed into the aforementioned organic solution. For soaking, the raw silver-based powder is loaded into the organic solution of the oxidation inhibitor, and, if necessary, is stirred.

There is no special restriction with regard to the treatment temperature, but the treatment temperature is preferably between room temperature and 100° C. It is preferable to conduct the immersion for 1 hour to 50 hours. The silver-based powder is then removed from the solution, if necessary, rinsed in an organic solvent for removal of the excess of the oxidation inhibitor adhered to the surface of the particles, and dried for more than 24 hours at a temperature between room temperature and 105° C.

In an alternative, second process, while using the organic solution of the oxidation inhibitor as a lubrication agent, the raw silver-based powder is subjected to application of mechanical energy in a conventional powder crushing device such as a stamp mill, ball mill, vibration mill, hammer mill, rolling mill, mortar, or the like. There is no special restriction with regard to the treatment temperature in this process, but since the process is accompanied by generation of heat, the temperature should be adjusted to a value between room temperature and 100° C., and the process should be conducted for 1 hour to 50 hours. If it is necessary to remove the excess of the oxidation inhibitor stuck to the surface of the particles, the treated silver-based powder may be rinsed in an organic solvent and dried for more than 24 hours at a temperature between room temperature and 105° C. Such a process makes it possible to produce flake-like silver-based particles that possess electrical and thermal conductivity. Furthermore, crushing of the silver-based powder activates the surface of the silver particles, improves adherence and chemical bonding of the oxidation inhibitor to this surface, prevents aggregation of the particles, and promotes formation of the flaky shape.

There are no special restriction with regard to the size of the silver particles used in the second method, but in order to obtain particles having an average size within the range of 0.1 to 20 μm, it is preferable that a raw silver-based powder (used to prepare the silver-based powder of this invention) has an average particle size within the range of 0.1 to 50 μm. There are no restrictions on the shape of the silver particles, and the particles may have granular, dendrite, flake-like, or irregular shapes. Particles of two or more different shapes can be used in a mixture.

There are no special restrictions with regard to the amounts in which the oxidation inhibitor should be added. However, it is recommended to add oxidation inhibitor in an amount of 0.01 to 2 parts by weight per 100 parts by weight of the silver-based powder. If the oxidation inhibitor is added in an amount below the lower recommended limit of the range, it would be impossible to provide sufficient surface treatment of the silver powder. If the upper recommended limit is exceeded, the obtained silver powder will have either a reduced electrical and thermal conductivity, or lower affinity to the curable organic resin composition.

There are no special restrictions on the mechanism for curing the curable silicone composition of this invention. For example, curing can be carried out by means of a hydrosilylation reaction, condensation reaction, or free-radical reaction with the use of organic peroxide. The use of a silicone composition curable with the hydrosilylation reaction is preferable. Such silicone composition may comprise the following components:

(A) 100 parts by weight of an organopolysiloxane having at least two alkenyl groups per molecule;

(B) an organopolysiloxane having at least two silicon-bonded hydrogen atoms per molecule, where the silicon-bonded hydrogen atoms of component (B) are used in an amount of 0.5 to 5 per one alkenyl groups of component (A);

(C) 50 to 2,000 parts by weight of a silver-based powder surface-treated with an oxidation inhibitor; and (D) a platinum catalyst in an amount required for promoting the hydrosilylation reaction.

Component (A) is an organopolysiloxane with at least two alkenyl groups per molecule. The alkenyl groups of component (A) may be represented by vinyl groups, allyl groups, butenyl groups, pentenyl groups, hexenyl groups, and heptenyl groups, of which the vinyl groups are preferable. There is no special restriction with regard to the bonding positions of the aforementioned alkenyl groups and they may assume positions on the molecular terminals and/or in the side chains. In component (A), silicon-bonded organic groups, other than the aforementioned alkenyl groups, may comprise substituted or unsubstituted univalent hydrocarbon groups, such as methyl groups, ethyl groups, propyl groups, butyl groups, pentyl groups, hexyl groups, or similar alkyl groups; phenyl groups, tolyl groups, xylyl groups, or similar aryl groups; benzyl groups, phenethyl groups, or similar aralkyl groups; 3,3,3-trifluoropropyl groups, or similar halogenated alkyl groups. Methyl groups and phenyl groups are preferred. There are no restrictions on the molecular structure of component (A). Component (A) may have a linear structure, partially-branched linear structure, branched structure, or net-like structure, of which the linear structure, or a partially branched linear structure are preferable. There are no restrictions on viscosity of component (A) at 25° C., but preferably, viscosity should be between 50 and 500,000 milliPascal·seconds (mPa·s), and especially between 400 and 10,000 mPa·s.

Examples of organopolysiloxanes of component (A) include a copolymer of methylvinylsiloxane and dimethylsiloxane having both terminal ends of the molecular chain blocked by trimethylsiloxy groups, a methylvinylpolysiloxane having both terminal ends of the molecular chain blocked by trimethylsiloxy groups, a copolymer of methylphenylsiloxane and methylvinylsiloxane having both terminal ends of the molecular chain blocked by trimethylsiloxy groups, a copolymer of methylphenylsiloxane, methylvinylsiloxane, and dimethylsiloxane having both terminal ends of the molecular chain blocked by trimethylsiloxy groups, a dimethylpolysiloxane having both terminal ends of the molecular chain blocked by dimethylvinylsiloxy groups, a methylvinylpolysiloxane having both terminal ends of the molecular chain blocked by dimethylvinylsiloxy groups, a methylphenylpolysiloxane having both terminal ends of the molecular chain blocked by dimethylvinylsiloxy groups, a copolymer of methylvinylsiloxane and dimethylsiloxane having both terminal ends of the molecular chain blocked by dimethylvinylsiloxy groups, a copolymer of methylphenylsiloxane and dimethylsiloxane having both terminal ends of the molecular chain blocked by dimethylvinylsiloxy groups, a copolymer of methylvinylsiloxane and dimethylsiloxane having both terminal ends of the molecular chain blocked by silanol groups, a methylvinylpolysiloxane having both terminal ends of the molecular chain blocked by silanol groups, a copolymer of methylphenylsiloxane, methylvinylsiloxane, and dimethylsiloxane having both terminal ends of the molecular chain blocked by silanol groups, silicone resins composed of $R_3SiO_{1/2}$ units and $SiO_{4/2}$ units, silicone resins composed of $RSiO_{3/2}$ units, silicone resins composed of $R_2SiO_{2/2}$ units and $RSiO_{3/2}$ units, silicone resins composed of $R_2SiO_{2/2}$ units, $RSiO_{3/2}$ units, and $SiO_{4/2}$ units, or mixtures of the aforementioned compounds. In the resins, each R designates substituted or unsubstituted univalent hydrocarbon group, and at least two R's in one molecule of each of the aforementioned resins are alkenyl groups. In the resins, R may be the same substituted or unsubstituted alkenyl groups or those groups other than alkenyl groups that have been mentioned above.

Component (B) is used as a cross-linking agent for curing component (A) and comprises an organopolysiloxane that has at least two silicon-bonded hydrogen atoms per molecule. There are no special restriction with regard to the bonding positions of the hydrogen atoms in component (B), and they may assume positions on the molecular terminals and/or in the side chains. In component (B), silicon-bonded organic groups, other than the aforementioned hydrogen atoms, may comprise substituted or unsubstituted univalent hydrocarbon groups, preferably, methyl groups and phenyl groups. There are no restrictions on the molecular structure of component (B). Component (B) may have a linear structure, partially-branched linear structure, branched structure, or net-like structure, of which the linear structure, or a partially branched linear structure are preferable. There are no restrictions on viscosity of component (B) at 25° C., but preferably, it should be between 1 and 50,000 mPa·s, and especially between 5 and 1,000 mPa·s.

Examples of organopolysiloxanes of component (B) include a methylhydrogensiloxane having both terminal ends of the molecular chain blocked by trimethylsiloxy groups, a copolymer of methylhydrogensiloxane and dimethylsiloxane having both terminal ends of the molecular chain blocked by trimethylsiloxy groups, a copolymer of methylphenylsiloxane and methylhydrogensiloxane having both terminal ends of the molecular chain blocked by trimethylsiloxy groups, a copolymer of methylphenylsiloxane, methylhydrogensiloxane, and dimethylsiloxane having both terminal ends of the molecular chain blocked by trimethylsiloxy groups, a dimethylpolysiloxane having both terminal ends of the molecular chain blocked by dimethylhydrogensiloxy groups, a methylhydrogenpolysiloxane having both terminal ends of the molecular chain blocked by dimethylhydrogenpolysiloxy groups, a copolymer of methylhydrogensiloxane and dimethylsiloxane having both terminal ends of the molecular chain blocked by dimethylhydrogensiloxy, a copolymer of methylphenylsiloxane and dimethylsiloxane having both terminal ends of the molecular chain blocked by dimethylhydrogensiloxy groups, a methylphenylpolysiloxane having both terminal ends of the molecular chain blocked by dimethylhydrogensiloxy groups, a methylhydrogenpolysiloxane having both terminal ends of the molecular chain blocked by silanol groups, a copolymer of methylhydrogensiloxane and dimethylsiloxane having both terminal ends of the molecular chain blocked by silanol groups, a copolymer of methylphenylsiloxane and methylhydrogensiloxane having both terminal ends of the molecular chain blocked by silanol groups, and a copolymer of methylphenylsiloxane, methylhydrogensiloxane, and dimethylsiloxane having both terminal ends of the molecular chain blocked by silanol groups.

Component (B) should be used in an amount sufficient to provide 0.5 to 5 of silicon-bonded hydrogen atoms contained in component (B) for 1 alkenyl group of component (A). If component (B) is used in an amount below the lower recommended limit of the range, it would be impossible to provide sufficient curing of the obtained composition. If the upper recommended limit is exceeded, the obtained cured body of silicone will have reduced thermal resistance.

Component (C) is the aforementioned silver-based powder. Component (C) imparts to a cured body obtained by curing the composition of the invention electroconductive and thermoconductive properties. Component (C) should be used in an amount of 50 to 2000 parts by weight, preferably 300 to 600 parts by weight for each 100 parts by weight of component (A). If component (C) is used in an amount below the lower recommended limit of the range, the obtained cured silicone body will have low electrical conductivity. If the upper recommended limit is exceeded, the obtained composition will be difficult to handle and mold in the production.

Component (D) is a platinum-type catalyst that accelerates curing of the present composition. Normally, this is a known platinum-type catalyst used in hydrosilylation reactions. Component (D) can be represented by platinum black, platinum on an alumina carrier, platinum on a silica carrier, platinum on a carbon carrier, a chloroplatinic acid, an alcoholic solution of a chloroplatinic acid, a platinum-olefin complex, a complex of platinum and alkenyl siloxane, or catalysts formed by dispersing the aforementioned compounds in thermoplastic organic resins such as methylmethacrylate, polycarbonate, polystyrene, silicone resin, etc.

Although there are no restrictions with regard to the amounts in which component (D) can be used in the composition of the invention, it is recommended that in terms of weight units metallic platinum be within the range of 0.1 to 1000 parts per million (ppm). If component (D) is added in an amount below the lower recommended limit of the range, the obtained curable silicone composition will be insufficiently cured. If the upper recommended limit is exceeded, the obtained cured product may encounter coloration problems.

The composition is prepared by uniformly mixing components (A) through (D). To minimize variations in contact resistance and volumetric resistivity of the cured body over time, the composition may be additionally combined with component (E), an organosilicon compound that contains silicon-bonded alkoxy groups. The following are examples of such organosilicon compounds: tetramethoxysilane, tetraethoxysilane, dimethyldimethoxysilane, methylphenyldimethoxysilane, methylphenyldiethoxysilane, phenyltrimethoxysilane, methyltrimethoxysilane, methyltriethoxysilane, vinyltrimethoxysilane, allyltrimethoxysilane, allyltriethoxysilane, 3-glycidoxypropyltrimethoxysilane, 3-methacryloxypropyltrimethoxysilane, or similar alkoxysilanes; siloxanes represented by the following formulae:

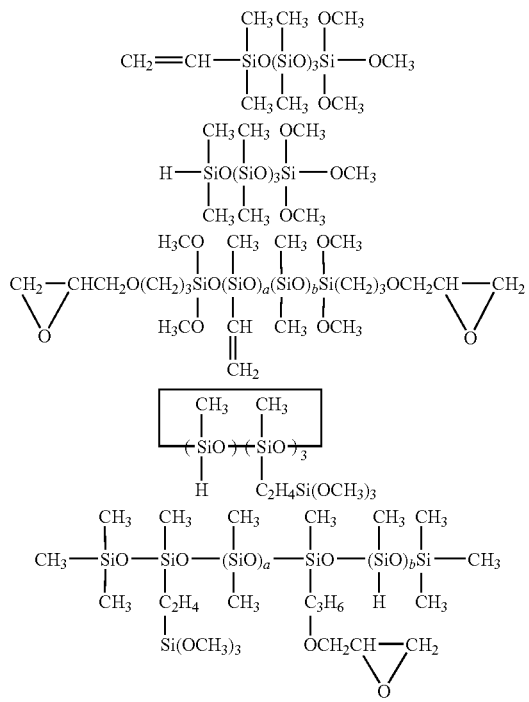

where "a" and "b" are integers that are equal to 1 or exceed 1.

In the composition of the invention, component (E) is optional. When component (E) is included, it should be used in an amount of less than 20 parts by weight, preferably 0.5 to 10 parts by weight for each 100 parts by weight of component (A). Without the use of component (E), the curable silicone composition may either have poor adhesiveness or electrical resistance and volumetric resistivity changeable over time in the cured product. If component (E) is used in an amount exceeding the upper recommended limit of the range, either the obtained curable silicone composition will have low storage stability, or the cured product obtained from the silicone composition will have physical properties changeable over time.

To improve storage stability and facilitate handling during treatment, the composition of the invention can be additionally combined with other additives, such acetylenic alcohols exemplified by 2-methyl-3-butyn-2-ol, 3,5-dimethyl-1-hexyn-3-ol, 2-phenyl-3-butyn-2-ol, or similar alkyne alcohols; 3-methyl-3-penten-1-yne; 3,5-dimethyl-3-hexen-1-yne, or similar enyne compounds; 1,3,5,7-tetramethyl-1,3,5,7-tetravinylcyclotetrasiloxane, 1,3,5,7-tetramethyl-1,3,5,7-tetrahexenylcyclotetrasiloxane, or a similar alkenylsiloxane oligomer; benzotriazole, or similar curing inhibitors. Although there are no special restriction with regard to the amounts in which the curing inhibitors can be added, it is recommended to add them in an amount of 0.001 to 5 parts by weight for each 100 parts by weight of component (A).

To impart to the cured product an increased hardness and strength, the composition can be combined with an inorganic filler, such as fumed silica, crystalline silica, baked silica, wet-process silica, fumed titanium oxides, etc.; or inorganic fillers surface treated with organosilicon compounds, such as organoalkoxysilane, organochlorosilane, organodisilazane, etc. Although there are no special restrictions with regard to the amounts in which the aforementioned inorganic fillers can be added, it is recommended to add them in an amount of 50 parts by weight or less for each 100 parts by weight of component (A).

There are no special restrictions on the form in which the cured product can be obtained. For example, it can be formed as a rubber, gel, or a similar elastomer, or as a hard resin. The elastomeric form is preferable. Especially when component (C) is a flake-like silver powder, the cured product obtained from the composition of the invention may have volumetric electrical resistivity of 0.1 Ohm·cm or less, and even $1 \times 10^{-3}$ Ohm·cm or less, and thermal conductivity of 1 W/mK or more, and even 3 W/mK or more. The composition of the invention may be used as a raw material for manufacturing electroconductive adhesive agents, heat-radiating adhesive agents, electroconductive die-bonding agents, heat-radiating die-bonding agents, electroconductive pastes, heat-radiating pastes, electromagnetic shielding agents, as well as for manufacturing electroconductive sheets, heat-radiating sheets, and electromagnetic-wave absorption sheets.

EXAMPLES

In these examples, all viscosities correspond to 25° C. Evaluations of changes over time in such properties as curability of the composition, volumetric resistivity of the cured product, thermal conductivity, and adhesive properties were carried out as described below.

Change in Curability of the Curable Silicone Composition Over Time

After the curable silicone composition was prepared and cooled, it was cured by heating for 30 minutes (min.) at 150° C. directly after the preparation (initial stage), after one-week storage, after one-month storage, and after three-month storage, and then hardness of the cured body of each type was measured with the use of a Type A durometer as specified by JIS K 6253.

Change in the Volumetric Resistivity of the Silicone Composition Over Time

The curable silicone composition was heat-treated for 30 min. at 150° C. and formed into a cured silicone sheet having a thickness exceeding 1 millimeter (mm). Volumetric resistivity of the sheet was measured using a resistivity measurement device (model K-705RL manufactured by Kyowa Riken Ltd.). For evaluating changes in the volumetric resistivity of the silicone sheet over time, the sheet was heated in an oven at 150° C., and the volumetric resistivity was measured by the method mentioned above after heating the sheet during 100 hours, 500 hours, and 1000 hours.

Thermal Conductivity of the Cured Silicone Product

A 1 mm-thick cured silicone sheet was made by heating the silicone composition of the invention at 150° C. for 30 min. Thermal conductivity of the sheet was calculated on the basis of specific heat, density, and a coefficient of thermal diffusion obtained with the use of a laser flash instrument.

Adhesiveness of the Cured Silicone Product

The curable silicone composition was spread over a nickel substrate and then formed by heating for 30 min. at 150° C. into a cured silicone coating. In evaluating conditions of peeling of the silicone coating from the nickel substrate, peeling with rupture of the cured silicone was designated as ○, and peeling with separation along the interface was designated as X.

Change in Curability of a Curable Epoxy Composition Over Time

After a curable epoxy composition was prepared and cooled, its appearance was visually observed directly after the preparation (initial stage), after one-week storage, after one-month storage, and after three-month storage, and then curability was evaluated by curing the composition at 150° C. for 1 hour.

Change in Volumetric Resistivity of the Cured Epoxy Resin Product Over Time

The curable epoxy composition was heat-treated for 1 hour at 150° C. and formed into a cured epoxy sheet having a thickness exceeding 1 mm. Volumetric resistivity of the sheet was measured using a resistivity measurement device (model K-705RL manufactured by Kyowa Riken Ltd.). For evaluating changes in the volumetric resistivity of the epoxy sheet over time, the sheet was heated in an oven at 150° C., and the volumetric resistivity was measured by the method mentioned above after heating the sheet during 100 hours, 500 hours, and 1000 hours.

Thermal Conductivity of the Cured Epoxy Product

A 1 mm-thick cured epoxy sheet was made by heating the curable epoxy composition at 150° C. for 1 hour. Thermal conductivity of the sheet was calculated on the basis of specific heat, density, and a coefficient of thermal diffusion obtained with the use of a laser flash instrument.

Adhesiveness of the Cured Epoxy Product

The curable epoxy composition was spread over a nickel substrate and then formed into a cured epoxy coating by heating for 1 hour at 150° C. In evaluating conditions of peeling of the epoxy coating from the nickel substrate, peeling with rupture of the cured epoxy and with the formation of cracks in the cured coating was designated as ○, and peeling with separation along the interface was designated as X.

Example 1

20 grams (g) of silver nitrate were dissolved in 40 milliliters (ml) of water, and then a 46 wt. % aqueous solution of sodium hydroxide was added to cause precipitation of granular-shaped silver oxide. After subjecting the obtained granular-shaped silver oxide to reduction in formalin, the product was rinsed, filtered several times, and dried at room temperature. A reduced silver powder having granular-shaped particles with an average particle size of 2 μm was prepared.

200 g of the reduced silver powder prepared by repeating the method as mentioned above and 80 g of a 30 wt. % acetone solution of benzotriazole as a lubricant for the process were loaded into a ball mill, where the reduced silver powder was crushed. After the crushed silver powder was washed with acetone and dried at room temperature, silver powder (I) surface-treated with benzotriazole was prepared.

A uniform mixture was prepared from 100 parts by weight of a 10 Pa·s viscosity dimethylpolysiloxane having both molecular terminals capped with dimethylvinylsiloxy groups, 0.71 parts by weight of a 10 mPa·s viscosity methylhydrogenpolysiloxane having both molecular terminals capped with trimethylsiloxy groups (this component contains two silicon-bonded hydrogen atoms per 1 vinyl group in the aforementioned dimethylpolysiloxane), 1035 parts by weight of the silver powder surface-treated as mentioned above, 23 parts by weight of a siloxane compound represented by the following formula:

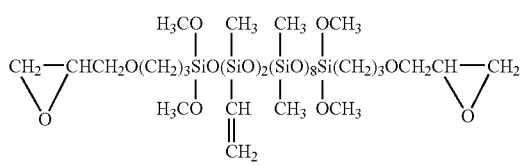

a fine-powdered platinum catalyst (added, in weight units, in an amount of 32 ppm of the metallic platinum relative to the weight of the composition), and 2-phenyl-3-buten-2-ol (added, in weight units, in an amount of 60 ppm relative to the weight of the composition). Thus, a hydrosilylation-curable silicone-rubber composition was prepared.

The obtained silicone rubber composition was evaluated with regard to change of curability and volumetric resistivity over time, as well as with regard to thermal conductivity and adhesiveness in the cured silicone rubber product obtained from the aforementioned composition. The results are shown in Table 1.

Example 2

200 g of atomized silver powder having spherical particles of a 5 μm average particle size and produced by atomization in water were immersed for 5 hours at 50° C. into 80 g of a 10 wt. % acetone solution of benzotriazole. The solution was filtered and dried at room temperature. As a result, silver powder (II) surface treated with benzotriazole was produced.

A hydrosilylation-curable silicone rubber composition was prepared by the same method as in Example 1, with the exception that the silver powder (II) surface treated with benzotriazole was used instead of the silver powder of Example 1. The obtained silicone rubber composition was evaluated with regard to change of curability and volumetric resistivity over time, as well as with regard to thermal conductivity and adhesiveness in the cured silicone rubber product obtained from the aforementioned composition. The results are shown in Table 1.

Comparative Example 1

20 g of silver nitrate were dissolved in water, and then a 46 wt. % aqueous solution of sodium hydroxide were added to cause precipitation of granular-shaped silver oxide. After subjecting the obtained granular-shaped silver oxide to reduction in formalin, the product was rinsed, several times filtered, and dried at room temperature. A reduced silver powder having granular-shaped particles with an average particle diameter of 2 μm was prepared.

200 g of the reduced silver powder prepared by repeating the method as mentioned above and 100 g of a 20 wt. % carbitol acetate solution of stearic acid as a lubricant for the process were loaded into a ball mill, where the reduced silver powder was crushed. After the crushed silver powder was washed with methanol and dried at room temperature, silver powder (III) surface-treated with stearic acid was prepared.

A hydrosilylation-curable silicone rubber composition was prepared by the same method as in Example 1, with the exception that the aforementioned silver powder (III) was used instead of the silver powder of Example 1. The obtained silicone rubber composition was evaluated with regard to change of curability and volumetric resistivity over time, as well as with regard to thermal conductivity and adhesiveness in the cured silicone rubber product obtained from the aforementioned composition. The results are shown in Table 1.

Comparative Example 2

A hydrosilylation-curable silicone rubber composition was prepared by the same method as in Example 1, with the exception that an atomized silver powder (IV) with an average particle diameter of 5 μm was used instead of the silver powder of Example 1. The obtained silicone rubber composition was evaluated with regard to change of curability and volumetric resistivity over time, as well as with regard to thermal conductivity and adhesiveness. The results are shown in Table 1.

Example 3

200 g of atomized silver powder for use as a lubricating agent having spherical particles of a 2 μm average particle size and produced by atomization in water were immersed into 80 g of a 30 wt. % acetone solution of benzotriazole, and the atomized sliver powder was then crushed in a ball mill. The crushed silver powder was washed with acetone and dried at room temperature. As a result, silver powder (V) surface treated with benzotriazole was produced.

A hydrosilylation-curable silicone rubber composition was prepared by the same method as in Example 1, with the exception that silver powder (V) was used instead of the silver powder of Example 1. The obtained silicone rubber composition was evaluated with regard to change of curability and volumetric resistivity over time, as well as with regard to thermal conductivity and adhesiveness in the cured silicone rubber product obtained from the aforementioned composition. The results are shown in Table 1.

Comparative Example 4

200 g of atomized silver powder having spherical particles of a 2 μm average particle size and a lubricating agent in the form of 100 g of a 2000 mPa·s viscosity 10 wt. % xylene solution of dimethylpolysiloxane having both molecular terminals capped with dimethylvinylsiloxy groups were loaded into a ball mill, where the atomized silver powder was crushed. The crushed silver powder was washed with xylene and dried for 24 hours at 150° C. As a result, silver powder (VI) surface treated with dimethylpolysiloxane was produced.

A hydrosilylation-curable silicone rubber composition was prepared by the same method as in Example 1, with the exception that silver powder (VI) was used instead of the silver powder of Example 1. The obtained silicone rubber composition was evaluated with regard to change of curability and volumetric resistivity over time, as well as with regard to thermal conductivity and adhesiveness in the cured rubber product. The results are shown in Table 1.

Practical Example 4

200 g of electrolytic having a dendrite shape and a 10 μm average particle size and a lubricating agent in the form of 80 g of 10 wt. % acetone solution of 2,6-di-t-butyl-4-methylphenol were loaded into a ball mill, where the electrolytic silver powder was crushed. The crushed silver powder was washed with acetone and dried at room temperature. As a result, silver powder (VII) surface treated with benzotriazole was produced.

A hydrosilylation-curable silicone rubber composition was prepared by the same method as in Example 1, with the exception that the aforementioned silver powder (VII) was used instead of the silver powder of Example 1. The obtained silicone rubber composition was evaluated with regard to change of curability and volumetric resistivity over time, as well as with regard to thermal conductivity and adhesiveness in the cured silicone rubber product obtained from the aforementioned composition. The results are shown in Table 1.

TABLE 1

| Categories | Present Invention | | | | Comparative Examples | | |
|---|---|---|---|---|---|---|---|
| Characteristics | Example 1 | Example 2 | Example 3 | Example 4 | Comp. Ex. 1 | Comp. Ex. 2 | Comp. Ex. 3 |
| Untreated silver powder | Reduced silver | Atomized silver | Atomized silver | Electrolytic silver | Reduced silver | Atomized silver | Atomized silver |
| Surface-treating agent | Benzotriazole | Benzotriazole | Benzotriazole | 2,6-di-t-butyl-4-methylphenol | Stearic acid | None | Dimethylpolysiloxane |
| Silver powder after surface treatment | | | | | | | |
| Average particle size (μm) | 7 | 5 | 5 | 10 | 7 | 5 | 5 |
| Shape | Flake shape | Spherical | Flake shape | Flake shape | Flake shape | Flake shape | Flake shape |
| Properties of Silicone Rubber | | | | | | | |
| Hardness | | | | | | | |
| Initial | 60 | 52 | 50 | 60 | 60 | 50 | 50 |
| After 1 day storage | 60 | 52 | 50 | 60 | 55 | 5 | 10 |
| After 1 week storage | 60 | 52 | 50 | 60 | 40 | Uncured | Uncured |
| After 1 month storage | 60 | 52 | 50 | 60 | 20 | Uncured | Uncured |
| After 3 month storage | 58 | 52 | 50 | 59 | Uncured | Uncured | Uncured |
| Volumetric resistivity (Ohm · cm) | | | | | | | |
| Initial | $3 \times 10^{-4}$ | 100 | 0.1 | $3 \times 10^{-4}$ | $3 \times 10^{-4}$ | 100 | 0.1 |
| After 100 hours | $3 \times 10^{-4}$ | 100 | 0.1 | $3 \times 10^{-4}$ | $6 \times 10^{-4}$ | 100 | 0.1 |
| After 500 hours | $3 \times 10^{-4}$ | 100 | 0.1 | $3 \times 10^{-4}$ | $2 \times 10^{-3}$ | 100 | 0.1 |
| After 1000 hours | $4 \times 10^{-4}$ | 100 | 0.1 | $5 \times 10^{-4}$ | $3 \times 10^{-3}$ | 100 | 0.1 |
| Thermal conductivity (° C./W) | 4 | 0.8 | 1 | 3 | 4 | 0.8 | 1 |
| Adhesiveness | ○ | ○ | ○ | ○ | X | ○ | ○ |

Example 5

A curable epoxy resin composition was prepared by adding silver powder (V) of Example 3 in an amount of 75 wt. % to a commercial curable epoxy resin (EP-106 of Cemedine Co.). The obtained epoxy rubber composition was evaluated with regard to change of curability and volumetric resistivity over time, as well as with regard to thermal conductivity and adhesiveness. The results are shown in Table 2.

Comparative Example 4

A curable epoxy resin composition was prepared by the same method as in Example 5, with the exception that the aforementioned silver powder (II) was used instead of silver powder (V) of Example 3. The obtained epoxy resin composition was evaluated with regard to change of curability and volumetric resistivity over time, as well as with regard to thermal conductivity and adhesiveness in the cured epoxy resin product obtained from the composition. The results are shown in Table 2.

TABLE 2

| Categories Characteristics | Present Invention Example 5 | Comparative Example Comp. Ex. 4 |
|---|---|---|
| Untreated silver powder | Atomized silver | Atomized silver |
| Surface-treating agent | Benzotriazole | Benzotriazole |
| Silver powder after surface treatment | | |
| Average particle size (μm) | 5 | 5 |
| Shape | Flake shape | Spherical |
| Properties of Composition | | |
| Curability and appearance | | |
| Initial | Cured | Cured |
| After 1 day storage | Cured | Cured |
| After 1 week storage | Cured | Gelation |
| After 1 month storage | Cured | Gelation |
| After 3 month storage | Cured | Gelation |
| Properties of cured Product | | |
| Volumetric resistivity (Ohm · cm) | | |
| Initial | $3 \times 10^{-4}$ | $2 \times 10^{-2}$ |
| After 100 hours | $3 \times 10^{-4}$ | $2 \times 10^{-2}$ |
| After 500 hours | $3 \times 10^{-4}$ | $2 \times 10^{-2}$ |
| After 1000 hours | $4 \times 10^{-4}$ | $2 \times 10^{-2}$ |
| Thermal conductivity (° C./W) | 4 | 2 |
| Adhesiveness | ○ | ○ |

INDUSTRIAL APPLICABILITY

When a curable organic resin composition is compounded with the silver-based powder of the present invention, the composition becomes less prone to a decrease in curability over time. Furthermore, the method of preparation of the silver-based powder in accordance with the invention is highly efficient. Another effect of the invention is that a cured product obtained from the aforementioned composition is characterized by reduced change in curability and electrical properties over time.

The invention claimed is:

1. A method for preparing a curable silicone composition, said method comprising the steps of:
   a) utilizing an organic solution of an oxidation inhibitor comprising a phenol-based or triazole-based compound as a lubricating agent,
   b) applying mechanical energy to a silver-based powder,
   c) subjecting the silver-based powder to surface treatment with the oxidation inhibitor, and
   d) incorporating the surface-treated silver-based powder into the curable silicone composition.

2. A method as set forth in claim 1 wherein the oxidation inhibitor is a triazole-based compound.

3. A method as set forth in claim 1 wherein the oxidation inhibitor is a phenol-based compound.

4. A method as set forth in claim 1 wherein the oxidation inhibitor is further defined as a hindered phenol-based compound.

5. A method as set forth in claim 1 wherein the curable silicone composition is curable with a hydrosilylation reaction.

6. A method as set forth in claim 5 wherein the curable silicone composition comprises:
   (A) 100 parts by weight of an organopolysiloxane having at least two alkenyl groups per molecule;
   (B) an organopolysiloxane having at least two silicon-bonded hydrogen atoms per molecule, where component (B) is present in an amount sufficient to provide silicon-bonded hydrogen atoms in an amount of 0.5 to 5 per one alkenyl group of component (A);
   (C) 50 to 2,000 parts by weight of the silver-based powder, surface-treated with the oxidation inhibitor, for each 100 parts by weight of component (A); and
   (D) a platinum catalyst in an amount required for promoting the hydrosilylation reaction.

7. A method as set forth in claim 1 wherein the oxidation inhibitor is present in an amount of 0.01 to 2 parts by weight per 100 parts by weight of the silver-based powder.

8. A method as set forth in claim 7 wherein the silver-based powder is present in an amount of 300 to 600 parts by weight for each 100 parts by weight of component (A).

9. A method as set forth in claim 1 wherein the step of applying mechanical energy is further defined as crushing, shocking, or rolling the silver-based powder.

10. A method as set forth in claim 1 wherein the oxidation inhibitor is a triazole-based compound, the step of applying mechanical energy is further defined as crushing, shocking, or rolling the silver-based powder, the curable silicone composition is curable with a hydrosilylation reaction, and the curable silicone composition comprises:
    (A) 100 parts by weight of an organopolysiloxane having at least two alkenyl groups per molecule;
    (B) an organopolysiloxane having at least two silicon-bonded hydrogen atoms per molecule, where component (B) is present in an amount sufficient to provide silicon-bonded hydrogen atoms in an amount of 0.5 to 5 per one alkenyl group of component (A);
    (C) 50 to 2,000 parts by weight of the silver-based powder, surface-treated with the oxidation inhibitor, for each 100 parts by weight of component (A); and
    (D) a platinum catalyst in an amount required for promoting the hydrosilylation reaction, the oxidation inhibitor is present in an amount of 0.01 to 2 parts by weight per 100 parts by weight of the silver-based powder, and the silver-based powder that is surface-treated with the oxidation inhibitor is present in an amount of 300 to 600 parts by weight for each 100 parts by weight of component (A).

11. A method as set forth in claim 1 wherein the step of subjecting the silver-based powder to surface treatment with the oxidation inhibitor occurs after the step of applying mechanical energy to the silver based-powder.

* * * * *